Figure 1:
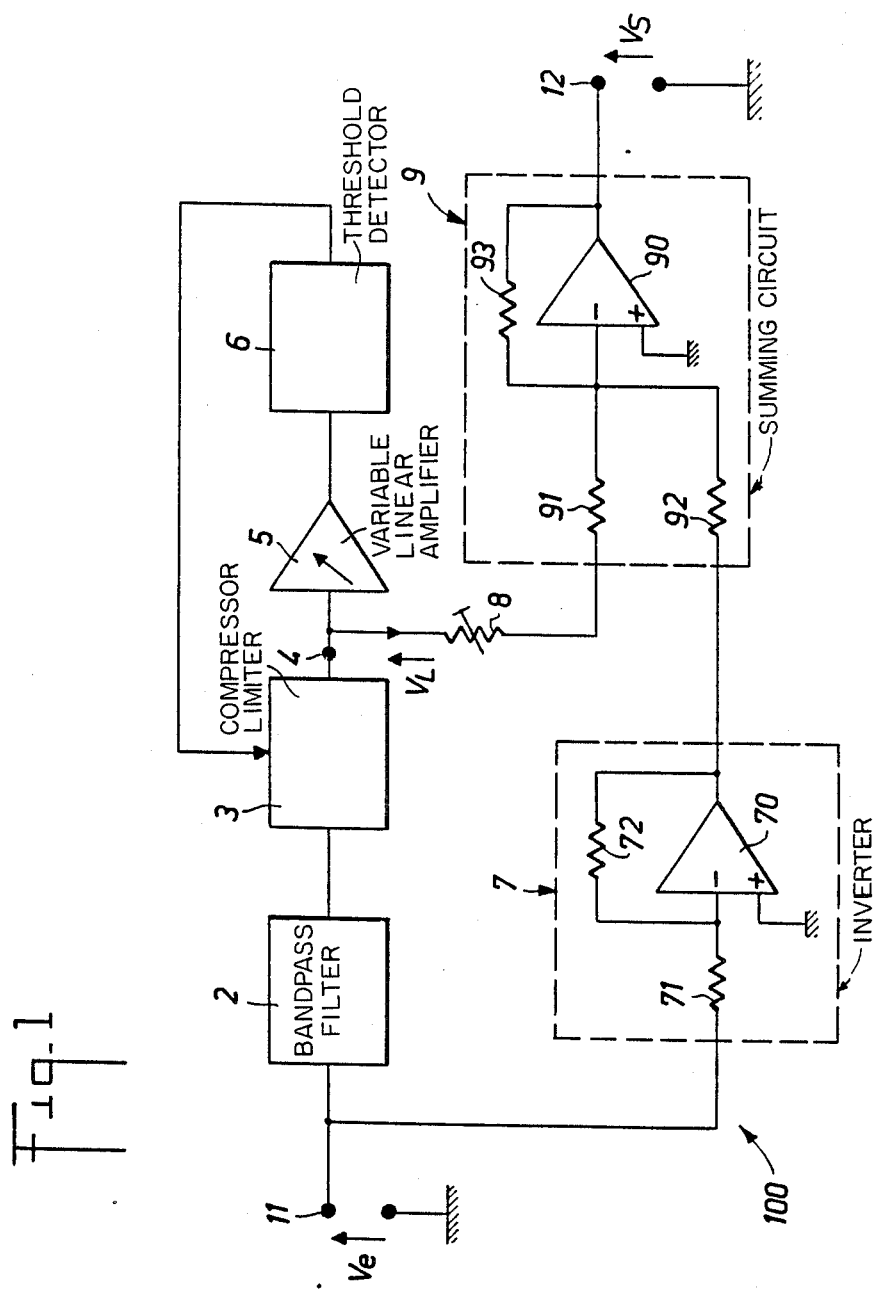

United States Patent [19]

Imreh

[11] Patent Number: 4,815,142
[45] Date of Patent: Mar. 21, 1989

[54] NOISE REDUCTION DEVICE IN AN ELECTROACOUSTIC SYSTEM

[75] Inventor: Miklos Imreh, Fourqueux, France

[73] Assignee: Elison, Paris, France

[21] Appl. No.: 54,819

[22] Filed: May 27, 1987

[30] Foreign Application Priority Data

May 30, 1986 [FR] France ................................ 86 07813

[51] Int. Cl.$^4$ ............................................. H04B 1/64
[52] U.S. Cl. ...................................... 381/106; 333/14; 455/72
[58] Field of Search .......................... 381/106; 333/14; 455/72

[56] References Cited

U.S. PATENT DOCUMENTS

| | | |
|---|---|---|
| 3,757,254 | 9/1973 | Takahashi et al. |
| 3,784,749 | 1/1974 | Shizeyama et al. |
| 3,930,208 | 12/1975 | Winter et al. |
| 4,035,739 | 7/1977 | Dickopp et al. ........................ 333/14 |
| 4,071,695 | 1/1978 | Flanagan et al. ..................... 381/106 |
| 4,218,662 | 8/1980 | Shroeder ................................ 333/14 |
| 4,550,426 | 10/1985 | Gillig et al. ........................... 381/106 |

FOREIGN PATENT DOCUMENTS 2490856 3/1982 France .
2152785 8/1985 United Kingdom ................. 381/106

Primary Examiner—John W. Caldwell, Sr.
Assistant Examiner—Alvin Oberley
Attorney, Agent, or Firm—Curtis, Morris & Safford

[57] ABSTRACT

The device comprises at least one correction circuit interposed in the electroacoustic system and comprising a band-pass filter receiving an input signal, a compressor limiter circuit connected to the output of the band-pass filter, a threshold detector circuit connected to the output of the compressor-limiter circuit and looped thereon in order to allow compression, by said compressor limiter circuit, of the signal issued from the band-pass filter, only if the input signal exceeds a predetermined threshold, and a summing-inverter circuit to which is applied, on the one hand, the signal issued from said compressor limiter circuit, and on the other hand, via an inverter circuit, the input signal applied to the input of the band-pass filter. According to the invention, a plurality of correction circuits can be cascade-mounted, said circuits comprising band-pass filters of which the pass-bands are different but do not necessarily overlap.

8 Claims, 3 Drawing Sheets

NOISE REDUCTION DEVICE IN AN ELECTROACOUSTIC SYSTEM

The present invention relates to a noise-reduction device in an electroacoustic recording or reproducing system.

Various types of noise-reduction devices are already known for attenuating the noise caused by the transmission or storage of information.

In a first type of noise-reduction device, such as for example, one of the systems known as Dolby (Registered Trademark) or Dbx, it is necessary first to encode information during the recording operation and then to decode the information when said information is read or reproduced. Coding may be achieved in the form of a compression of the signal, whereas decoding corresponds to an expansion of the signal. With such a system, two complementary apparatus must be used to obtain an improvement of the signal-to-noise ratio. Moreover, this system is unsuitable for reducing, during reproduction, the noise due to bad quality or corrupted recordings which have not been suitably encoded at recording time, for example because they are too old.

Another type of noise-reduction device uses band-pass filters followed by noise-suppressing gates which, without a data signal, cut off all the information available in input. This system, therefore, does not actually achieve a reduction of the noise, but rather a suppression, which may also prove detrimental to the data signal itself.

Other types of noise reduction devices use variable gain amplifiers for an overall processing of the information, this resulting in poor-performance devices or in devices delicate to produce.

Another noise-reduction system has also been proposed in which the audio or video frequency band considered is sliced with a set of band-pass filters arranged in parallel, each filter receiving the input signal of which the signal to noise ratio is to be improved. Each filter is coupled to a compressor limiter having a programmable threshold so as to allow the passage of a data signal, only if in the considered pass-band, the signal level exceeds a predetermined threshold. Such a system however implies having a large number of filters with accurately overlapping pass bands, which increases the cost and complexity of the system.

It is the object of the present invention to overcome the aforesaid disadvantages by proposing a noise-reduction device which is altogether inexpensive, reliable and usable without any encoding of the signal, and which can be in the form of separately constructed units.

These objects are reached with a noise reduction device for use in an electroacoustic recording and reproducing system comprising at least one correction circuit interposed in the electroacoustic system and comprising a band-pass filter receiving an input signal, a compressor limiter circuit connected to the output of the band-pass filter, a threshold detector circuit connected to the output of the compressor-limiter circuit and looped thereon in order to allow compression, by said compressor limiter circuit, of the signal issued from the band-pass filter, only if the input signal exceeds a predetermined threshold, and a summing-inverter circuit to which is applied, on the one hand, the signal issued from said compressor limited circuit, and on the other hand, via an inverter circuit, the input signal applied to the input of the band-pass filter.

The device according to the invention may comprise a single stage for eliminating noise corresponding to a specific frequency band.

However, the device may advantageously comprise a plurality of correction circuits cascade-mounted in the electroacoustic system and comprising band-pass filters, the pass-bands of which are different but do not necessarily overlap.

In this case, the pass-bands of the band-pass filters of the correction circuits successively mounted in cascade, are preferably increasing.

According to one feature of the invention, the threshold detection circuit comprises a variable gain linear amplifier connected to the output of the compressor limiter circuit, and a voltage reference circuit.

More particularly, the threshold detection circuit further comprises a delay circuit controlling the compressor limited circuit, with a predetermined time constant adapted to the pass-band of the filter.

According to one special embodiment of the invention, the threshold detection circuit comprises a voltage doubler circuit connected to the output of the variable gain linear amplifier, and the voltage reference circuit comprises at least one Zener diode.

According to another advantageous feature of the invention, the compressor-limiter circuit comprises an operational amplifier and a V-MOS field effect transistor controlled by the threshold detection circuit for selectively short-circuiting the input to the operational amplifier when the threshold detection circuit detects that a predetermined voltage threshold has been exceeded.

Figure 2:
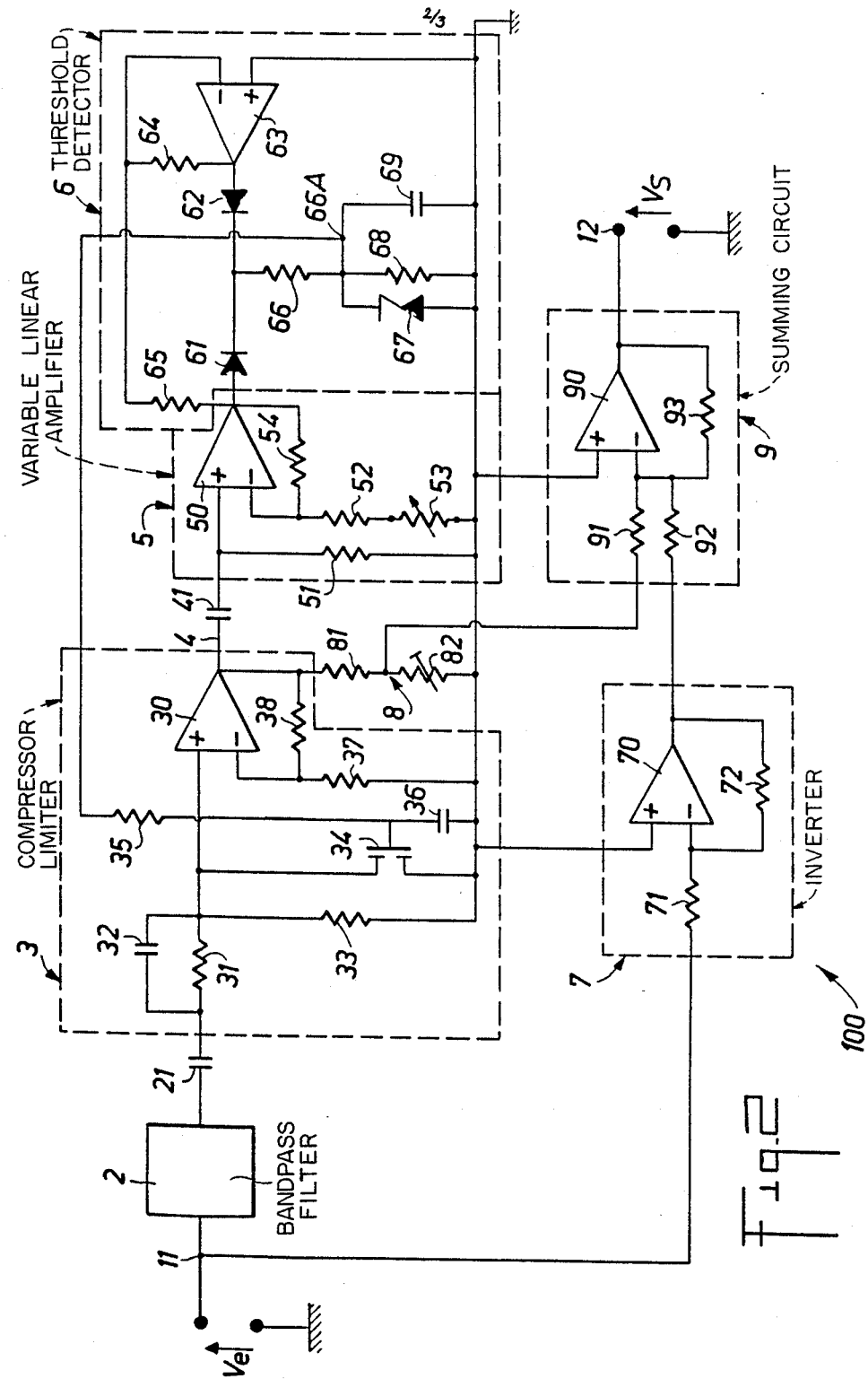
Figure 3:
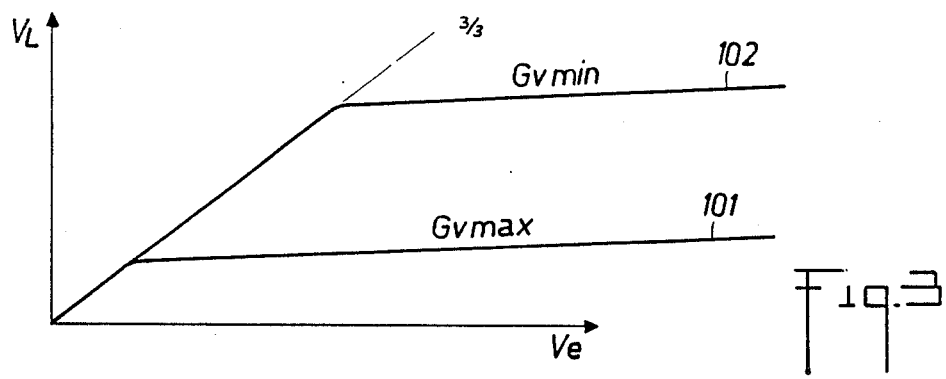
Figure 4:
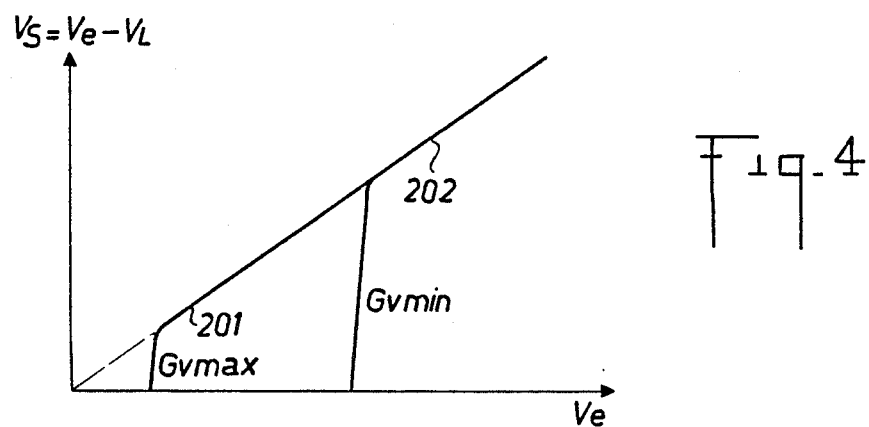
Figure 5:
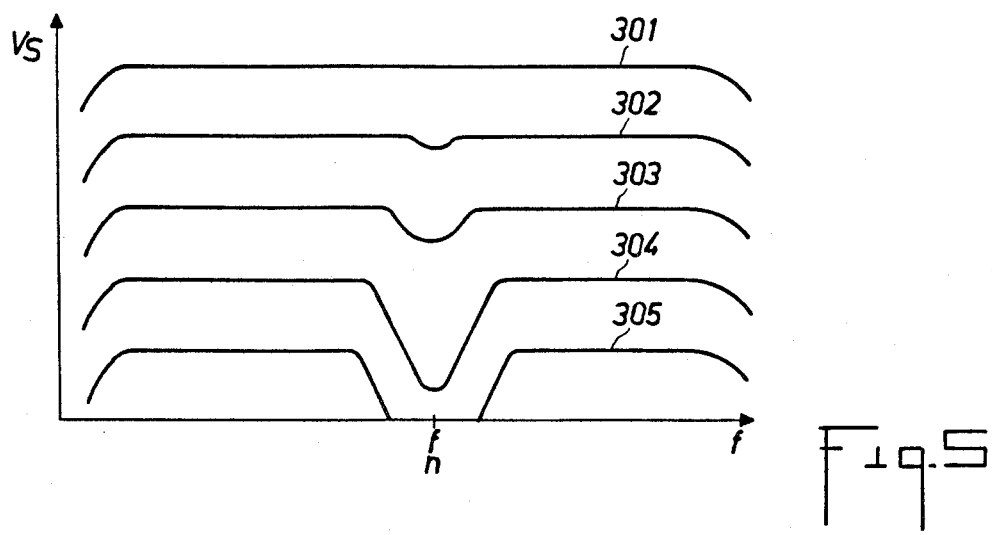

The invention will be more readily understood on reading the following description with reference to the accompanying drawings, in which:

FIG. 1 is a block diagram showing a correction circuit incorporated in a noise reduction device according to the invention, FIG. 2 is a more detailed diagram of one embodiment of the equalizing circuit according to the invention, FIG. 3 shows diagrams illustrating the evolution of a compensating voltage $V_L$ as a function of an input voltage $V_e$ for maximum and minimum values of the gain of the variable gain linear amplifier of the correction circuit shown in FIGS. 1 and 2, FIG. 4 shows diagrams illustrating the evolution of output voltage $V_S$ as a function of the input voltage $V_e$ for maximum and minimum values of the gain of the variable gain linear amplifier of the correction circuit shown in FIGS. 1 and 2, and FIG. 5 shows curves illustrating the evolution of output voltage $V_S$ as a function of frequency f for various levels of the input signal.

Referring first to FIG. 1, this represents a block diagram of a correction circuit 100 which performs the dynamic filtering of an input signal $V_e$ applied to the input 11 of circuit 100 in order to supply to output 12 of the correction circuit 100, an output voltage signal $V_S$ of which the noise to signal ratio is improved within a predetermined frequency band.

The correction circuit 100 thus acts inside a limited frequency band, centered on a predetermined frequency $f_n$. A plurality of correction circuits 100, each one operating within a limited frequency band, which may or may not overlap the frequency band of other correction circuits, can be cascade-mounted one after the other to improve the signal to noise ratio over a wider frequency band. In this case, advantageously, the correction circuits operating in low frequencies and having the narrowest frequency bands, will be placed upstream of the correction circuits operating in the high frequencies and having the widest frequency bands.

By way of example, a noise-reduction device according to the invention can comprise five or six cascade correction stages 100, the first two stages operating at the bottom of the frequency spectrum in order to reduce noises created at the power supply frequency (50 or 60 Hz) or at a frequency corresponding to harmonics thereof, and the next three or four correction stages operating at the top of the frequency spectrum within a range of approximately 3 to 15 KHz to eliminate the hum superposed on the data signal.

Of course, the noise reduction device according to the invention can work with a larger number of cascade-mounted correction circuits or on the contrary with only one correction circuit when correction around a specific frequency is required. The advantage of the device is that it is expandable, due to its construction as separate units, and that it is relatively inexpensive since the different correction circuits or separate units all have the same overall structure. In particular, it is possible with the device according to the invention, to more or less reduce the noise level over the whole spectrum as a function of the number of correction stages, but whatever the number of stages, the data signal is preserved integrally.

There now follows a detailed description of the correction circuit 100 of FIG. 1. The input signal $V_e$ available on the input 11 is applied, first to a band-pass filter 2, and second, via a resistor 71, to the inverter input of an operational amplifier 70 which constitutes, with resistor 71 and with a loop resistance 72, an inverter circuit 7. The output of inverter amplifier 7 is applied to one of the inputs of a summing amplifier 9.

The output of pass-band filter 2 is connected to the input of a compressor-limiter circuit 3 of which the output 4 is itself connected to a second input of the summing circuit 9 via an element 8 for adjusting the level of the voltage $V_L$ having the same sign as input voltage $V_e$, available at the output 4 of the compressor-limiter circuit 3. Output 4 of the compressor-limiter circuit 3 is further connected to the input of an adjustable gain linear amplifier 5 of which the output is applied to a threshold detector circuit 6, itself controlling the operation of the compressor-limiter circuit 3.

The summing amplifier 9 comprises an operational amplifier 90 of which the inverter input is connected to the output via a loop resistance 93 and receives the signals issued from the output 4 of the compressor-limiter circuit 3 and the output of the inverter amplifier 7 via resistors 91, 92 respectively.

The correction circuit 100 illustrated in FIG. 1 works as follows.

The variable gain linear amplifier 5 looped by the threshold and time constant detector circuit 6 on the compressor-limiter 3 shows a gain which is adjustable between a minimum value $G_{vmin}$ and a maximum value $G_{vmax}$. The threshold detector circuit 6 being itself adjusted to react when the voltage at the output of the variable gain amplifier 5 exceeds a preset level or threshold, the operation of compressor-limiter 3 will be determined by the value of gain $G_v$ of amplifier 5 which will define an effective threshold triggering the operation of compressor-limiter 3. In practice, if $V_b$ is the voltage of the noise at the input of compressor-limiter 3, gain $G_v$ of amplifier 5 will be adjusted in such a way that compressor-limiter 3 only acts as a compressor if the voltage at the output of filter 2 exceeds value $V_b$. Thus, for all input signals $V_e$ such that, in the pass-band of filter 2, the output level of said filter is below a predetermined threshold $V_b$, the compressor-limiter retains a gain equal to 1 and outputs at point 4 a voltage signal $V_L$ which substantially corresponds to the input voltage of compressor-limiter 3 and is of similar sign. The summing circuit 9 then performs the addition of inverted input signal $V_e$ and signal $V_L$, by inverting the result of said addition, i.e; delivers an output signal $V_S$ equivalent to input signal $V_e$ but reduced by signal $V_L$ in the pass-band of filter 2. Thus, there has been a reduction of noise in said pass-band.

On the contrary, when the voltage at the input of compressor-limiter 3 exceeds the level $V_b$, said compressor-limiter 3 shows a high coefficient of attenuation and only delivers at point 4 a signal $V_L$ of negligible level, the maximum of which is level $V_G$. Signal $V_S$ outputted from summing amplifier 9 then practically corresponds to signal $V_e$ applied on input terminal 11 of correction circuit 100, reduced to a correction value $V_L$ which is but a small proportion of value $V_e$.

FIGS. 3 and 4 show the course of the curves illustrating first the rectifying voltage $V_L$ at output 4 of compressor-limiter 3, and second, output voltage $V_S$ at output 12 of the rectifying device 100, as a function of input voltage $V_e$ for two adjusting values $G_{vmax}$ (curves 101 and 201) and $G_{vmin}$ (curves 102 and 202) of the variable gain amplifier 5 looped on compressor-limiter 3, and for the pass-band of filter 2.

FIG. 5 shows the course of output voltage $V_S$ as a function of frequency f with a correction device 100 having a band-pass filter 2 centered on a frequency fn, for various decreasing values of input voltage $V_e$ (curves 301 to 305). It is noted that for high input voltage levels, which are higher than the threshold voltage, compressor-limiter 3 delivers a signal $V_L$ which is very low compared to $V_e$, so that the level of output voltage $V_S$ is virtually unchanged around frequency fn (curve 301). On the contrary, when the level of input voltage $V_e$ decreases, entailing a general decrease of the level of output voltage $V_S$, compressor-limiter 3 produces a lesser attenuation in the pass-band of filter 2 centered on the frequency fn and voltage $V_L$ at the output of compressor-limiter 3 represents a fraction which is that much higher than input voltage $V_e$ that the latter is lower (curves 302, 303, 304). For very low levels of input voltage $V_e$ (curve 305), the output signal is even brought back to zero around frequency fn, input voltage $V_e$ being entirely compensated by voltage $V_L$ produced by compressor-limiter 3.

Reference is now made to FIG. 2 which illustrates a special embodiment of the correction circuit 100 of FIG. 1.

Compressor-limiter circuit 3 is connected via a coupling capacitor 21 to pass-band filter 2, the input of which is connected to input terminal 11 of correction circuit 100. Said compressor-limiter circuit 3 comprises an operational amplifier 30 of which the inverter input is, on the one hand, grounded via a resistor 37, and on the other hand, connected to the output of operational amplifier 30 via a resistor 38. The non-inverting input of operational amplifier 30 is itself connected, via a resistor 31, to the coupling capacitor 21 and grounded via a resistor 33. The drain-source space of a V-MOS type field effect transistor 34 is connected between the non-inverting input of operational amplifier 30, receiving the signals produced by filter 2, and the ground. The gate electrode of said V-MOS transistor 34 is itself, on the one hand, grounded via a capacitor 36, and on the other hand connected via a resistor 35 to the threshold and time constant detection circuit 6. A capacitor 32, in parallel on resistor 31, enables the compensation of stray capacitance due to the presence of V-MOS transistor 34.

Output 4 of compressor-limiter circuit 3 is connected via a coupling capacitor 41 to the non-inverting input of an operational amplifier 50 which constitutes, with combined resistors 51 to 54, an adjustable gain linear amplifier 5. A resistor 51 is connected between the non-inverting input of operational amplifier 50 and the ground, whereas a resistor 52, in series with an adjustable resistor 53, is connected between the inverting input of operational amplifier 50 and the ground. A resistor 54 is connected between the output and the inverting input of operational amplifier 50.

The threshold detection circuit 6 connected to the output of linear amplifier 5 comprises a voltage-doubler rectifying circuit 61 to 65, a voltage reference element 67 and an RC circuit 68, 69 supplying a time constant. The voltage-doubler circuit comprises an operational amplifier 63, the non-inverting input of which is grounded, the inverting input of which is connected via a resistor 65 to the output of linear amplifier 5, and the output of which is looped on the inverting input via a resistor 64. The output of operational amplifier 63 is connected to the anode of a diode 62, the cathode of which is connected to the cathode of a diode 61 of which the anode receives the output signals of linear amplifier 5. The cathodes of diodes 61 and 62 are connected via a resistor 66 to the output 66A of the threshold detection circuit 6, which output is connected via resistor 35 to the gate electrode of the V-MOS transistor 34 for controlling the compressor-limiter circuit 3.

Inside the threshold detection circuit 6, the voltage level reference is given by a Zener diode 67 connected between point 66A and the ground. A time constant circuit composed of capacitor 69, mounted in parallel on a resistor 68, is also connected between point 66A and the ground. Said time constant circuit is adapted to the pass band of filter 2. In the case of a filter 2 centered on a high frequency, the time constant introduced by RC circuit 68, 69 is indeed smaller than in the case of a filter 2 centered on a low frequency corresponding to the low noises, in order to avoid a pumping phenomenon in the compressor-limiter circuit 3.

V-MOS transistor 34 of compressor-limiter circuit 3 is blocked by circuits 5 and 6 when input signal $V_e$ is too low in level so that V-MOS transistor 34 is equivalent to a resistance of several megohms and causes no attenuation of the input signal in the limiter circuit 3.

The signal available at point 4 can then be transmitted by the divider bridge 8 constituted by a resistor 81 and an adjustable resistor 82 at the input of summing circuit 9 which input is connected to resistor 91. Summing circuit 9 then contributes to deducting in the pass-band of filter 2 from input signal $V_e$ applied by inverting circuit 7 on the second input of summing circuit 9, a voltage $V_L$ which is close to $V_e$, thus reducing the noise.

On the contrary, when signal $V_e$ contains a data signal which exceeds a threshold predetermined by circuits 5 and 6, the V-MOS transistor 34 is energized and acts as a limiter keeping the output signal of operational amplifier 30 to said predetermined threshold value; then the signal applied to resistor 91 of summing circuit 9 only serves to mask the residual noise whereas the data signal is virtually unchanged in relation to input signal $V_e$.

The correction device according to the invention makes it possible to improve considerably the dynamics of an audio or video source. For example, the variable gain amplifier 5 can be adjusted so as to obtain a gain between 0 and 60 dB. The compressor-limiter can itself have an operating range extending to more than 80 dB.

Moreover, the invention is applicable whatever the origin of the noise superposed to the data signal, whether this noise is caused by the recording, for example on a magnetic medium, or by a radio frequency transmission, or by the hiss from electronic circuits situated upstream such as preamplifiers.

What is claimed is:

1. A noise reduction device for an electroacoustic recording and reproducing system comprising at least one correction circuit interposed in the electroacoustic system, said correction circuit comprising,
    a band-pass filter having an input terminal for receiving an input signal and an output terminal,
    a compressor limiter circuit having first and second input terminals and an output terminal,
    a threshold detector circuit having an input terminal and an output terminal,
    a summing circuit having first and second inverting input terminals and an output terminal, and
    an inverter circuit having an input terminal for receiving the input signal and an output terminal, wherein the output terminal of the inverter circuit is connected to the first inverting input terminal of the summing circuit, the output terminal of the compressor limiter circuit is connected to the second inverting input of the summing circuit, the output terminal of the band-pass filter is connected to the first input terminal of the compressor limiter circuit, the output terminal of the threshold detector circuit is connected to the second input terminal of the compressor limiter circuit, and the output terminal of the compressor limiter circuit is connected to the input terminal of the threshold detector circuit, whereby the signal on the output terminal of the band-pass filter is compressed only if said signal exceeds a predetermined threshold detected by the threshold detector circuit.

2. A device as in claim 1, wherein a plurality of said correction circuits are cascade-mounted in the electroacoustic system and the pass-band for the band-pass filter in each of said correction circuits comprises a different range of frequencies which do not substantially overlap.

3. A device as in claim 1, wherein the threshold detector circuit comprises a variable gain linear amplifier connected to the output terminal of the compressor limiter circuit, and a voltage reference circuit.

4. A device as in claim 3, wherein the threshold detector circuit further comprises a delay circuit controlling the compressor limiter circuit with a predetermined time constant adapted to the pass-band frequencies of the band-pass filter.

5. A device as in claim 3, wherein the threshold detector circuit further comprises a voltage doubler circuit connected to the output terminal of the variable gain linear amplifier, and the voltage reference circuit comprises at least one Zener diode.

6. A device as in claim 1, wherein the compressor limiter circuit comprises an operational amplifier and a V-MOS field effect transistor controlled by the threshold detector circuit for selectively short-circuiting the input terminal to the operational amplifier when the threshold detector circuit detects that the predetermined voltage threshold has been exceeded.

7. A device as in claim 1, wherein the compressor limiter circuit comprises means for adjusting the voltage at the output terminal of the compresser limiter circuit.

8. A device as in claim 2, wherein the pass-band frequencies of the band-pass filters increase for each successive correction circuit mounted in cascade.

* * * * *